United States Patent [19]

Bieganski

[11] Patent Number: 4,648,773
[45] Date of Patent: Mar. 10, 1987

[54] CIRCUIT BOARD ASSEMBLY

[75] Inventor: Zdzislaw Bieganski, Harpenden, England

[73] Assignee: Abeco Limited, Milton Keynes, England

[21] Appl. No.: 753,221

[22] Filed: Jul. 9, 1985

[30] Foreign Application Priority Data

Jul. 14, 1984 [GB] United Kingdom ............... 8417978

[51] Int. Cl.⁴ ............................................. B65B 21/02
[52] U.S. Cl. ...................................... 414/411; 221/197; 221/312 B
[58] Field of Search ............... 414/403, 224, 411, 414, 414/425, 112, 749; 206/328, 334; 29/739, 740, 741, 759; 221/197, 198, 312 B; 198/416

[56] References Cited

U.S. PATENT DOCUMENTS 4,533,043  8/1985  Swain .................................. 206/328
4,553,190 11/1985  Mueller .......................... 206/328 X

FOREIGN PATENT DOCUMENTS 0038179 10/1981 European Pat. Off. ............ 206/328
0145023 11/1981 Japan .................................... 198/416
2030544  4/1980 United Kingdom ............... 206/328
2121764  1/1984 United Kingdom ............... 206/328

Primary Examiner—Robert J. Spar
Assistant Examiner—Lyle Kimms
Attorney, Agent, or Firm—C. O. Marshall, Jr.

[57] ABSTRACT

Integrated circuit components are loaded in Indian file in carrier tube and retained in position by headed pin at each end of the tube. The invention provides a spring bale to locate the tube in position on a support pillar, along which the tubes are fed under gravity, the spring bale providing a cam track for automatic engagement with a pin head so as to displace the pin to a position in which the chips can feed as the tube is assembled to the pillar without requiring any separate manipulative action.

4 Claims, 14 Drawing Figures

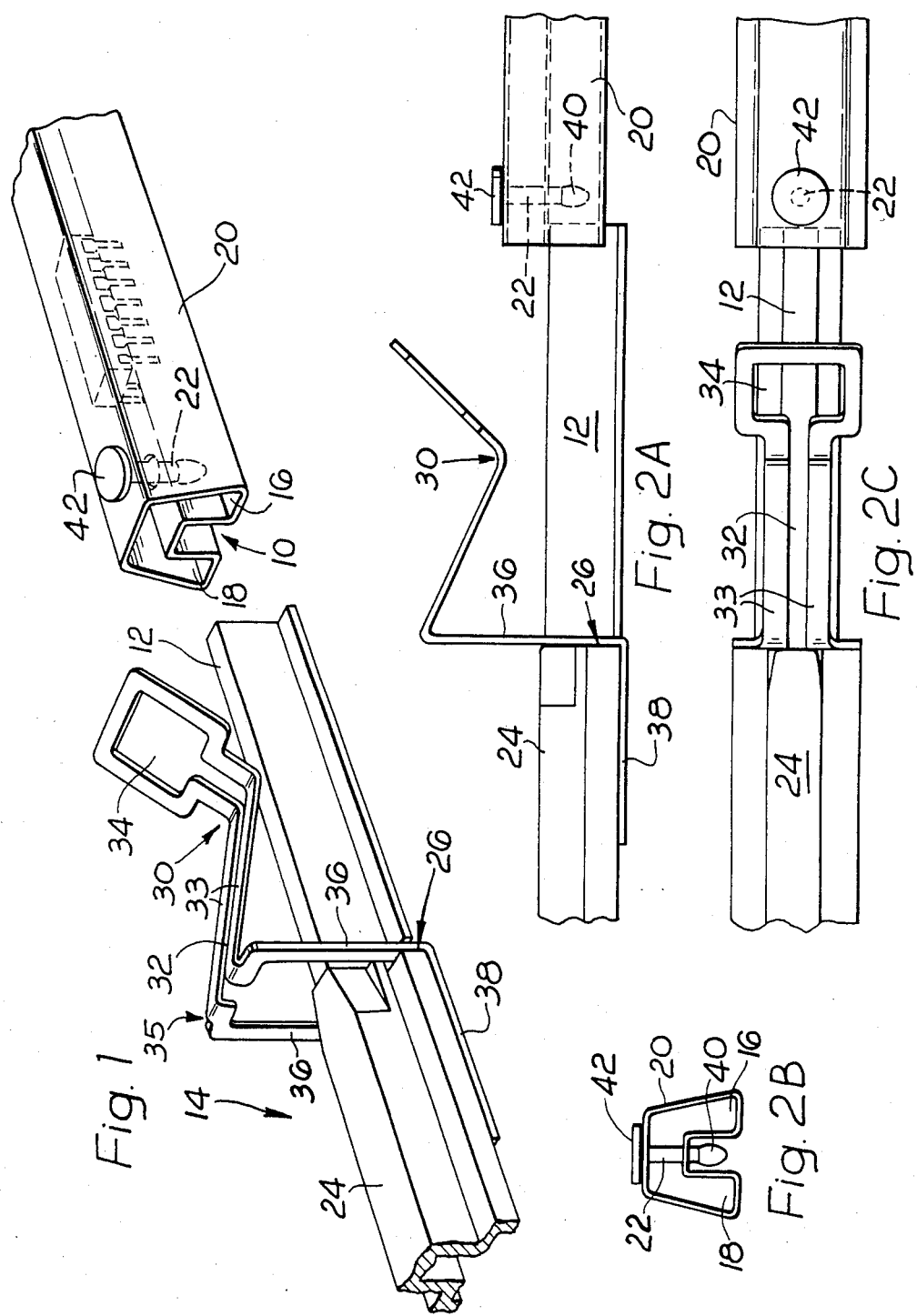

CIRCUIT BOARD ASSEMBLY

This invention relates to a circuit board assembly. The I.C's (Integrated Circuit Components or "chips") are loaded in tubular carriers or magazines, of a generally "A" cross-section so that a series of such components are arranged in single file end to end in each carrier. A pin is provided in each end of the carrier, having a head at one end and an enlarged foot at the other, and this is engaged through holes in opposite walls of the tube to retain the components in position. The carriers are used in association with a location device which usually comprises a panel inclined at a suitable angle, for example 60° to the horizontal, and provided with a series of generally parallel pillars. Each pillar includes a rib to enter a channel on a corresponding carrier tube, an abutment on which the end of the tube seats, a spring bail to hold the carrier to the pillar, and a further abutment so that after the pin has been removed from the carrier and the carrier has been correctly assembled to the pillar, I.C's feed by gravity down the pillar and come to rest on the second abutment, from which they can be removed individually for assembly to the circuit board. The pillars may be of different width to accommodate carrier tubes of different widths (for different sized components) and the second abutment may be in different positions to accommodate I.C's of different lengths.

The problem with the conventional arrangement described above is that of assembling new carrier tubes to the pillars, and also to a less extent that of removing part-used carrier tubes when required, as quickly as possible and without risk of the expensive I.C's falling out of the carriers. At present, the operation of loading a new full carrier tube in position requires the pin to be removed, the carrier located in a generally vertical position whilst loss of contents is prevented for example by one finger, while the spring is manipulated with the other hand and the parts generally aligned and adjusted in position. It calls for a deft and experienced operator if the job is to be done satisfactorily and quickly without loss of one or more chips.

According to the invention a circuit board assembly station provided with a pillar for connection to a carrier tube housing a plurality of I.C's arranged in single file for gravity feed from the tube onto a support area of the pillar, and a spring for releasably retaining the tube end in alignment with said pillar, the tube having an I.C. retaining pin extending transversely of the tube with a headed end facilitating pin manipulation to allow I.C. feed is characterised in that said spring comprises a pair of parallel portions forming a slot between which slot is of similar width to that of the shank of said pin, the length of said slot lying in a plane containing the axes of the tube and pillar, and slot having a first open end 30 near to said axes and a second end 35 away from said axes, said slot having said first end located towards the tube receiving end of the pillar and the second end away from the tube receiving end of the pillar, whereby alignment of the tube end with the pillar may engage said shank in the slot and axial displacement of the tube relative to the pillar may cam the pin to a non-retaining position with respect to the I.C's in the tube.

Preferably the spring is arranged to retain the pin after complete dis-engagement from the carrier, so that it remains instantly available in case of need as and when a part used carrier is to be removed.

The invention is more particularly described and illustrated with reference to the accompanying drawings in which:

FIG. 1 is a perspective fragmentary view showing an end of a carrier and the adjacent end of the pillar;

FIGS. 2 to 5 show the assembly step in four stages, each of FIGS. 2 to 5 including a side elevation A, an end view of a carrier B and a plan view C.

Figure 3A:
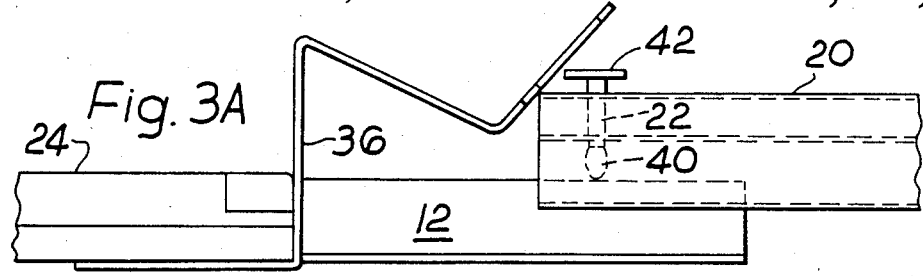

Referring to the drawing and particularly FIG. 1, the magazine or carrier is a tube of generally A cross-section having a groove 10 dimensioned to receive a rib 12 on the spigot end of a pillar generally indicated by the reference 14. The spaces 16, 18, on either side of the rib, and internally of the carrier, accept the contact terminals of the components, and the components slide on the rib being held in single file column by the dimensions of the carrier. The carrier tube is generally indicated by the reference numeral 20.

Adjacent each end, the control pin is provided shown in FIG. 1 by the reference numeral 22.

The pillar 14 has a portion 24 which is of generally inverted T section and is of similar dimensions to the base of the carrier so that when the carrier is finally positioned and the pin 22 has been removed, components can slide out of the carrier and along the support portion 24 without any impediment or barrier. Between the portion 24 and the rib 12 is an abutment shoulder 26 which is to be located closely adjacent to the end of the carrier tube 20. The portion 24 is also provided with one or more abutments, or possibly adjustable abutments, to form a stop so that for example only one I.C. would be received by the portion 24 at any time and after removal (assuming that the pillar and carrier extend generally vertically) another I.C. will slide down to that position ready for removal.

One form of the control spring which is the essence of the invention is best seen in FIG. 1, and the essential parts are the heel 30 or some similar formation which is to contact the carrier 20 when in the fully assembled position so as to hold the carrier against inadvertent displacement relative to the pillar. Also essential is the provision of the slot 32 provided between parallel portions 33 which is to receive the shank of the control pin, and which is similar in width to the shank of the pin and substantially smaller in transverse dimension than the head of the pin, as will be more particularly explained later in this specification. The slot 32 opens to an enlarged area or window 34 which is substantially wider than the pin 22. The slot lies in a plane containing the axes of the tube and of the pillar. The slot is inclined so that a first open end at 30 is close to the axes, and the second end 35 is more remote from the axes.

As shown in the drawings the spring is made as a pressing from sheet metal but it could be made from wire, and is integral with limbs 36 and a flange 38 which is trapped between the pillar and the board or plate on which the pillar is mounted, so as to fix the spring in position.

Referring now to FIG. 2 of the drawings, the carrier is shown with the pin fully engaged, so that the foot 40 at the bottom of the pin is located in the groove 10 in the carrier, and that groove is then aligned with and receives the end of the rib 12 on the pillar as shown in FIGS. 2A and 2C. This is the first or preparatory movement towards assembly of a new carrier to the pillar. It will be noted that the pin is in position and loss of components is prevented.

Figure 3B:
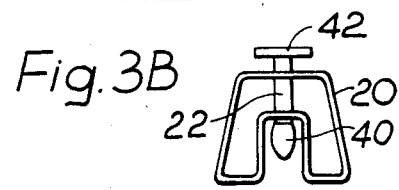
Figure 3C:
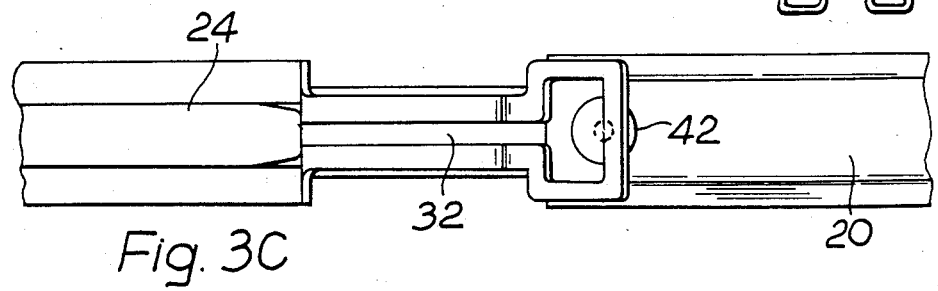

In FIG. 3, the carrier has been moved in a general axial displacement to the left and downwardly so that the enlarged lower end 40 of the pin contacts the top of the rib 12 and this displaces the pin axially so as to lift the head 42 clear of the carrier. This causes the head to project for manipulation, and incidentally cause the head to align with with the window in the spring. This alignment is best seen in FIG. 3C.

Figure 4A:
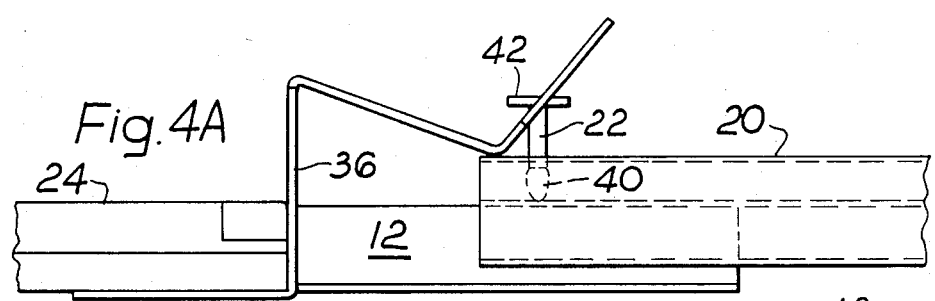
Figure 4B:
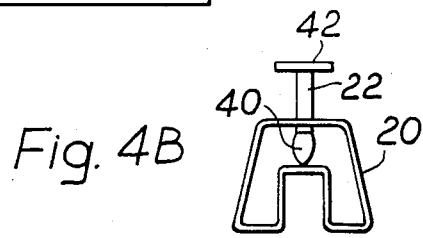
Figure 4C:
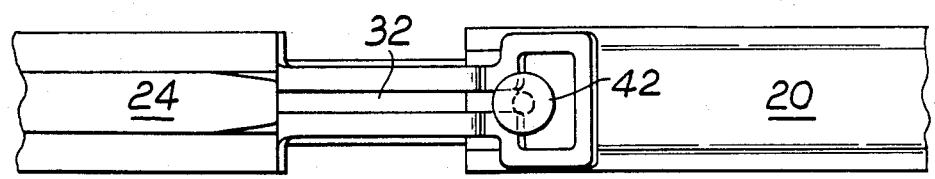

In FIG. 4, the movement of the carrier to the left in the figures has been continued and the shank of the pin has started to move into the narrow portion of the slot 32. The foot 40 is forced through the hole in the carrier, in passing from the FIG. 3A to the FIG. 4A positions. It is an interference fit in that hole.

Figure 5A:
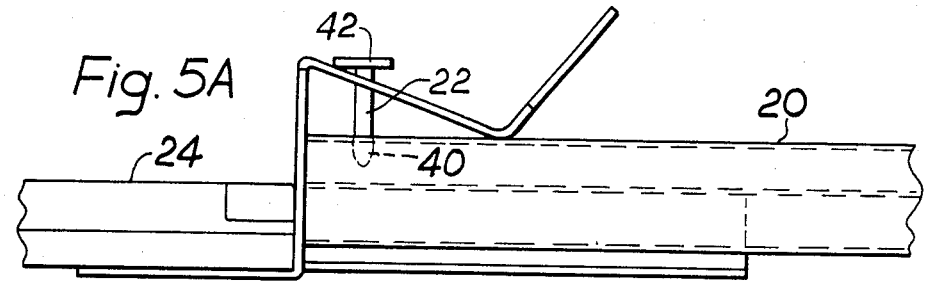
Figure 5B:
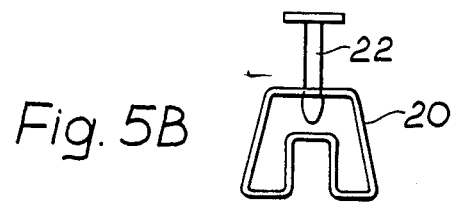
Figure 5C:
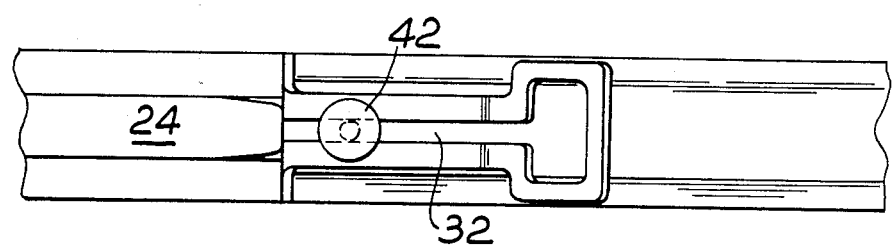
Figure 6:
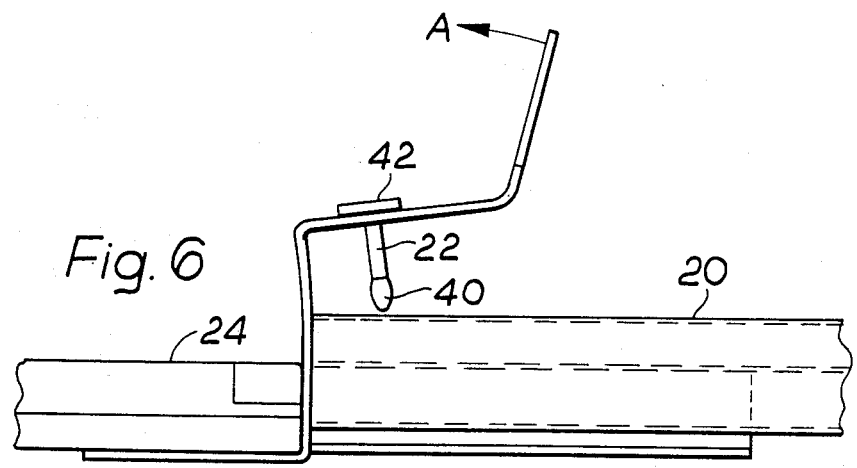
FIG. 6 is a fragmentary view similar to FIG. 2A but showing the assembly in the completed position.

In FIG. 5, the continued movement of the carrier to the left has taken the shank of the pin along the length of the slot, and due to the inclination of the slot in part, and the fact that the head 42 is too large to be withdrawn through the narrow slot, the spring has had an extractor effect. This is the effect which pulled the enlarged foot 40 through the interference hole in the tube wall at the top of the channel and hence located that enlarged foot within the carrier tube. Because the other pin hole in the tube is also an interference fit with the foot 40, the pin is retained in engagement with the tube, but positioned ready for removal. By manually displacing the window end of the spring in the direction of the arrow A as shown in FIG. 6, the pin could be pulled out of the carrier completely to allow gravity flow of I.C's out of the carrier. However it is preferred to perform this final operation manually, i.e. by pulling the pin out directly to avoid over-stressing the spring. The spring holds the carrier in position, and retains the pin loosely ready for re-use if a part loaded carrier is to be removed.

The spring can be made of round wire for example instead of a metal pressing.

I claim:

1. A circuit board assembly station comprising a carrier tube for holding a plurality of I.C.'s arranged in single file, a pillar having a support member arranged to receive I.C.'s by gravity feed from the carrier tube, a spring for releasably retaining the end of the tube in alignment with the pillar, and a pin having a head, and having a shank extending transversely into the end of the tube to retain I.C.'s in the tube, characterized in that said spring comprises a pair of parallel portions forming therebetween a slot whose width is similar to that of the shank of the pin, the length of the slot lying in a plane containing the axes of the tube and pillar, the slot having an open end which faces the pin and is less remote than its other end from said axes, whereby the pin is initially pushed outward by engagement with the pillar and then is engaged in the open end of the slot by axial displacement of the tube relative to the pillar to cam the pin outward into a non-retaining position with respect to I.C.'s in the tube.

2. A station as claimed in claim 1 wherein the pin has an enlarged end opposite to the headed end and characterised in that said slot is of a width less than the transverse dimension of said enlarged end.

3. A station as claimed in claim 2 characterised in that the spring is a sheet metal pressing and a window is provided at the open end of the slot, said window being larger than the pin head.

4. A station as claimed in claim 3 characterised in that the pillar has a rib arranged to enter a groove in the tube and in the initial assembly of tube to pillar cause axial displacement of the pin to free the head for manipulation.

* * * * *